United States Patent
Eberler et al.

(10) Patent No.: US 6,943,551 B2
(45) Date of Patent: Sep. 13, 2005

(54) MAGNETIC RESONANCE ANTENNA

(75) Inventors: Ludwig Eberler, Postbauer-Heng (DE); Razvan Lazar, Erlangen (DE); Jürgen Nistler, Erlangen (DE); Günther Zebelein, Möhrendorf (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/810,364

(22) Filed: Mar. 26, 2004

(65) Prior Publication Data
US 2005/0127914 A1    Jun. 16, 2005

(30) Foreign Application Priority Data
Mar. 28, 2003 (DE) ............................. 103 14 215

(51) Int. Cl.[7] .............................................. G01V 3/00
(52) U.S. Cl. ...................................... 324/318; 324/322
(58) Field of Search ................................ 324/318, 322, 324/309, 638; 600/410, 421

(56) References Cited

U.S. PATENT DOCUMENTS

| | | | | |
|---|---|---|---|---|
| 5,202,635 A | * | 4/1993 | Srinivasan et al. ......... | 324/322 |
| 5,371,468 A | * | 12/1994 | Pelster ......................... | 324/638 |
| 5,607,236 A | * | 3/1997 | Takagi et al. ................ | 374/117 |
| 6,232,779 B1 | * | 5/2001 | Tropp et al. ................. | 324/322 |
| 6,396,271 B1 | * | 5/2002 | Burl et al. ................... | 324/318 |
| 6,873,156 B2 | * | 3/2005 | Ferris et al. ................. | 324/318 |

OTHER PUBLICATIONS

Patent Abstracts of Japan 08187235, for Japanese Application No. 07001825 Relied on the Summary in the Specification.

* cited by examiner

Primary Examiner—Brij B. Shrivastav
(74) Attorney, Agent, or Firm—Schiff Hardin LLP

(57) ABSTRACT

A magnetic resonance antenna has longitudinal antenna rods in a birdcage structure, and antenna ferrules connecting the longitudinal antenna rods at their ends in terms of radio-frequency. The magnetic resonance antenna has a number of radio-frequency switching elements that interrupt, in terms of radio-frequency, at least one part of the longitudinal antenna rod to detune the eigen-resonance frequency of the antenna with respect to an operating magnetic resonance frequency. For this purpose, the magnetic resonance antenna is provided with two switching lines, directed to the radio-frequency switching elements from outside of the birdcage structure, the switching lines having a ring line connected thereto running annularly on or in the birdcage structure and transverse to the longitudinal antenna rods.

24 Claims, 5 Drawing Sheets

MAGNETIC RESONANCE ANTENNA

BACKGROUND OF THE INVENTION

1. Field of the Invention

The present invention concerns a magnetic resonance antenna of the type having longitudinal antenna rods disposed in parallel to each other in a birdcage structure, the longitudinal antenna rods being connected in terms of radio-frequency, to a ferrule or ring at each end, and radio-frequency switching elements connected to interrupt. In terms of radio-frequency at least one part of the longitudinal antenna rods to detune the eigen-resonance frequency of the antenna with regard to a working (operating) magnetic resonance frequency.

2. Description of the Prior Art

Modern magnetic resonance systems normally operate with a number of different antennas (also called coils in the following) to emit radio-frequency pulses for magnetic resonance excitation and/or to receive the resulting magnetic resonance signals. A magnetic resonance system typically has a larger coil, known as a whole-body coil, also called a bodycoil (BC), that normally is integrated into the device, as well as a number of small local coils (LC), also called surface coils. In contrast to the whole-body coil, the local coils (LC) serve to acquire detailed images of body parts or organs of a patient that are located relatively close to the surface of the body. For this purpose, the local coils are directly applied to the location of the patient at which the region to be examined is located. Given the use of such a local coil, in many cases magnetic resonance signals are excited with the whole-body coil (as a transmitter coil) integrated into the magnetic resonance system and are received with the local coil (as a receiver coil). So that the coils do not interact with one another, it is necessary to detune the receiver coil in the transmission phase and the transmitter coil in the reception phase. For detuning, the eigen-resonance frequency of the respective antenna is adjusted (set) such that it no longer lies in the range of the working magnetic resonance frequency. In the ideal case, an antenna detuned in this manner behaves neutrally. i.e. it is transparent to the radio-frequency energy emitted by the other coil and to the magnetic resonance signals induced by the other coil. If switching between two different antennas continuously occurs, this transitional detuning in the transmission phase or in the reception phase is called a "dynamic detuning". A coil also can be permanently detuned, however, if it should only be operated with one other coil. Such a "static detuning" is necessary particularly in cases when a transmission-capable local coil is used that assumes both the transmission and the reception function. Since the larger whole-body coil integrated into the system cannot be physically removed during the imaging measurement, it is electrically deactivated by the detuning.

A number of magnetic resonance antennas having a structure known as a birdcage structure are used as a whole-body coil. Such an antenna has a number of longitudinal, parallel antenna rods defining a cylindrical surface that are connected in terms of radio-frequency with one another at their ends by antenna ferrules or rings. The longitudinal antenna rods and antenna ferrules in principle can be fashioned in an arbitrary forms (shapes). In many cases they are conductor runs (tracks) that are applied to a flexible insulating foil and are cylindrically wound around the measurement space in which the examination subject is located during the examination. In a whole-body coil, the birdcage structure surrounds the patient acceptance chamber in which the patient is positioned during the measurement. In local coils having the form of a birdcage structure, the measurement volume of the local coil serves for exposure of the head of other extremities of a patient in order to precisely examine this region.

In principle there are various possibilities to detune such magnetic resonance antennas having a birdcage structure.

If the field strength of the basic magnetic field (also called $B_0$ field in the following) of the magnetic resonance system is below two Tesla, detuning is likely possible via the radio-frequency feed (supply line). To detune the antenna by means of a suitable circuit element, for example a PIN diode or a relay, a short circuit is produced at the end of the feed farthest from the coil. This short is transmitted via the feed to the feed point, i.e. the connection point, at which the feed is connected to the antenna. The detuning thereby achieved is sufficient to suppress coupling with the other active antenna. The advantage of such a coil-removed detuning is that the supply line for the direct current necessary for the circuit element presents no problem since, due to the large distance, no interaction of the circuit direct current with the high static and radiation detector fields is to be expected in the immediate environment of the antenna.

Such coil-removed detuning, however, has not proven to be suitable given higher $B_0$ field strengths. In such cases, ft is necessary to install the detuning elements directly into the structure of the antenna. For detuning an antenna with a birdcage structure, this can ensue by detuning that either the antenna ferrules, the longitudinal antenna rods or both. In such detuning, in general a resonant inductance is interrupted by means of a suitable radio-frequency switching element, or a resonant capacitor is bridged, i.e. shorted. Currently switching diodes, for example PIN diodes, are used as such radio-frequency switching elements, since these are able to withstand in terms of radio-frequency, both high currents and high voltages, and in addition can be switched sufficiently rapidly.

Ferrule detuning in a birdcage structure (compared to rod detuning) is advantageous because of easier access to the detuning elements, meaning the RF switching elements, from the exterior, such that the necessary direct current supply lines can be installed without problems. In terms of radio-frequency, however, such a ferrule detuning is not the optimal solution in a birdcage structure. In practice, antennas with birdcage structures therefore are known in which radio-frequency switching elements with which the longitudinal rods can be interrupted, so the entire rod structure can be detuned, are arranged within the longitudinal rods (meaning the longitudinal inductances). Each such RF switching element is individually fed with the necessary direct current signals from the outside, i.e. from outside the birdcage structure, A significant disadvantage of this approach is that these supply lines must be run through the resonant structure without disturbing the antenna with regard to its radio-frequency function. Each individual direct current supply line therefore must be individually choked and decoupled, for which special, very complexly manufactured lines must be used. Aside from the fact that space relationships inside the resonant structure are crowded and accessible components for the choking and decoupling can be accommodated only with difficulty, this assembly is very costly due to its high production complexity.

A birdcage antenna structure is known from published Japanese Application 08 187 235 in which each longitudinal rod is interrupted by two switching diodes connected with opposite polarities with regard to the longitudinal rod, but connected rectified with one another. The switching diodes of two adjacent longitudinal rods are in turn respectively connected in the same direction via LC parallel resonant circuits. Overall, a radio-frequency-damped ring switching line is formed in which all switching diodes are serially switched in succession. All switching diodes therefore can be switched together via supply lines directed out of the birdcage structure at both ends of the ring switching line. This assembly has the disadvantage, however, that a relatively high switching voltage must be applied to the switching line to detune the antenna, since the necessary blocking voltage (off-state voltage) applied at the individual switching diodes is determined by dividing the applied switching voltage by the total number of diodes. Moreover, the switching line must be relatively well-shielded, otherwise the magnetic field emitted by the switching line upon the rapid switching events will disturb the basic magnetic field of the magnetic resonance system. A further disadvantage is that the failure of an individual switching diode can block the entire function of the switching line, thus the assembly is unavoidably fault-prone.

SUMMARY OF THE INVENTION

An object of the present invention to provide a magnetic resonance antenna having a birdcage structure which can be detuned with lower switching voltages in an optimally simple, cost-effective and interference-insusceptible assembly by interruption of the longitudinal inductances. A further object is to provide a method to detune the eigen-resonance frequency of such an antenna.

This object is achieved by a magnetic resonance antenna having a birdcage structure as initially described, and having two common switching lines for the radio-frequency switching elements, directed to the radio-frequency switching elements from outside the birdcage structure, the switching lines being located in the individual longitudinal antenna rods. Each switching line has a ring line running annularly to the longitudinal antenna rods, or running transverse in the birdcage structure, to which the individual radio-frequency switching elements are each connected. This means two switching lines, a to-line and a from-line, are connected to the radio-frequency switching elements, for example an anode-side ring line and a cathode-side ring line given use of radio-frequency switching diodes.

The above object also is achieved in a method for detuning the eigen-resonant frequency of a magnetic resonance antenna having a birdcage structure as described above, including the steps of interrupting the longitudinal antenna rods in terms of radio-frequency with a number of radio-frequency switching elements, and switching each of the radio-frequency switching elements via two common switching lines connected to the radio-frequency antenna elements from outside of the birdcage structure, and forming the switching lines respectively as ring lines proceeding annularly on or in the birdcage structure transversely to the longitudinal antenna rods.

The radio-frequency switching elements thus can be switched via these common switching lines, such that an elaborate (and thus expensive) installation of a number of direct current lines within the resonant structure is unnecessary. In addition, the possible influence by the direct current lines on the structure is significantly reduced. Since in this assembly all radio-frequency switching elements can be connected in parallel with regard to both switching lines, essentially only the blocking voltage required at the radiation detector switching elements needs to be applied to the switching line as a switching voltage. In addition, the failure of one radio-frequency switching element does not lead to a complete blocking of the switching lines.

Since the radio-frequency switching elements normally are located at the same axial position between the ferrules in the longitudinal antenna rods, the ring line preferably runs precisely perpendicular to the longitudinal antenna rods, meaning the ring line runs in a plane that is parallel to the face surfaces of the birdcage structure.

The ring line preferably is connected to a supply line that runs from a front face (front wall) of the birdcage structure parallel to the longitudinal antenna rods. The switching line in this case is formed by the ring line with the supply line attached thereto. The supply line thereby preferably runs precisely perpendicular to the ring line.

The ring lines preferably are arranged at the same axial position running between the antenna ferrules, coaxial to one another on different radii, on and/or in the birdcage structure. If additionally the supply lines of the ring lines coming from the outside respectively run perpendicular to the appertaining ring line and are parallel adjacent to one another, this consequently symmetric design of the current feed to the radio-frequency switching elements assures that basically no magnetic field emanates from it.

In a preferred exemplary embodiment, one or both ring lines are galvanically interrupted at a location where the use of a capacitive element for galvanic interruption of the ring line is suitable, such that the ring line is closed with regard to radio-frequency. Such a galvanic interruption of the ring line has the advantage that eddy currents are prevented within the ring line. Given a switching of a gradient coil arranged in the magnetic resonance system, such eddy currents could be induced in the ring line and lead to heating of the ring line. The use of capacitive elements for galvanic interruption of the ring line has the advantage that the ring lines are closed in terms of radio-frequency, and thus asymmetries are prevented in the assembly of the antenna structure.

Further reactive components such as capacitors and/or inductive elements can be introduced into the appertaining ring line in order to adequately adjust the resonant length of the ring line, such that the eigen-resonance of the ring line is not in the working frequency range of the magnetic resonance system.

As already specified, radio-frequency switching diodes, for example PIN diodes, preferably are used as radio-frequency switching elements. In principle, however, other switching elements can be used, such as relays, transistors or electrostatically switched elements, as long as they can be switched fast enough and on the other hand can handle high radio-frequency demands.

In order to achieve an optimally good symmetry, the radio-frequency switching elements preferably are arranged near to or directly in the geometric center of the longitudinal antenna rods between the ferrules.

The connection of the radio-frequency switching elements to the switching lines or their ring lines depends on, among other things, which type of radio-frequency switching elements they are.

Given use of typical switching diodes, for example PIN diodes, a switching ensues via the connections of the diode and the longitudinal antenna rods. Thus, for example, a PIN diode is connected to the longitudinal antenna rods on the anode side and on the cathode side, and at the same time is switched by the application of a direct voltage on the anode-side input and the cathode-side input. This means that the radio-frequency switching elements are in these cases respectively connected with a connection to the ring line connected with the appertaining longitudinal antenna rod.

The longitudinal antenna rods also are unavoidably connected among one another via the appertaining ring line. There are various possibilities to prevent an interference with the radio-frequency antenna structure by the respective ring line.

One possibility is that at least one of the ring lines is connected between the ferrules to each of the appertaining longitudinal antenna rods in the region of the geometric center of each rod, ideally exactly in the geometric center. Since, in terms of radio-frequency, the geometric centers of the longitudinal antenna rods of a birdcage antenna represent an equipotential point (meaning the electrical potential of the center of the longitudinal rods is the same for all rods), the centers of the longitudinal rods can be electrically connected with one another without influencing the functionality of the magnetic resonance antenna.

Additionally or alternatively, the radio-frequency switching elements or the longitudinal antenna rods can also each be connected to the appertaining ring line via an inductive element. For example, simple choke coils can serve as inductive elements, but parallel resonant circuits made from choke coils and capacitors likewise can be used, but in this case the choke coils must have only a low number of windings. Choke coils also can be used that are precisely in resonance with the magnetic resonance operating frequency. It is important that the inductive elements act as low-pass elements or band elimination filters in the range of the working frequency of the birdcage resonator, and thus no effective radio-frequency coupling exists between the ring lines and the longitudinal antenna rods in the range of the operating frequency.

Connection of the radio-frequency switching elements with the respective ring line via chokes or other inductive elements has the additional advantage that these inductive elements also serve as protective resistors that provide for a compensation of the diode currents insofar as not all of the radio-frequency switching elements exhibit exactly the same parameters. Alternatively, in principle a connection of the radio-frequency switching elements to the switching lines to compensate the diode currents could also ensue via elements acting other than as ohmic resistors.

Given the use of choke coils for radio-frequency decoupling of the ring lines from the longitudinal antenna rods or from the radio-frequency switching elements, it must be taken into account that coils through which current flows generate their own static magnetic fields. In order to prevent the magnetic field of the choke coils from superimposing on the static magnetic resonance-relevant $B_0$ field, it is advantageous to minimize such a superimposition by suitable measures. For this purpose, the individual coils can be geometrically arranged on the birdcage structure such that the magnetic field generated by them is perpendicular to the direction of the $B_0$ field. Alternatively or additionally, the choke coils can be connected anti-parallel in pairs, such that the magnetic field components of the individual choke coils largely mutually cancel via vectorial superimposition.

Additionally, in order to prevent radio-frequency interferences from being introduced in the birdcage structure from the outside via the switching lines, the switching lines preferably are provided with a suitable low-pass filter on the input side.

Such an inventive magnetic resonance antenna and method in principle can be used in any arbitrary magnetic resonance device. The invention is, for the rest, independent of the size of the antenna, i.e. it can be used both in large whole-body antennas and in smaller surface antennas, insofar as these are fashioned according to a birdcage structure.

DESCRIPTION OF THE PREFERRED EMBODIMENTS

Figure 1:
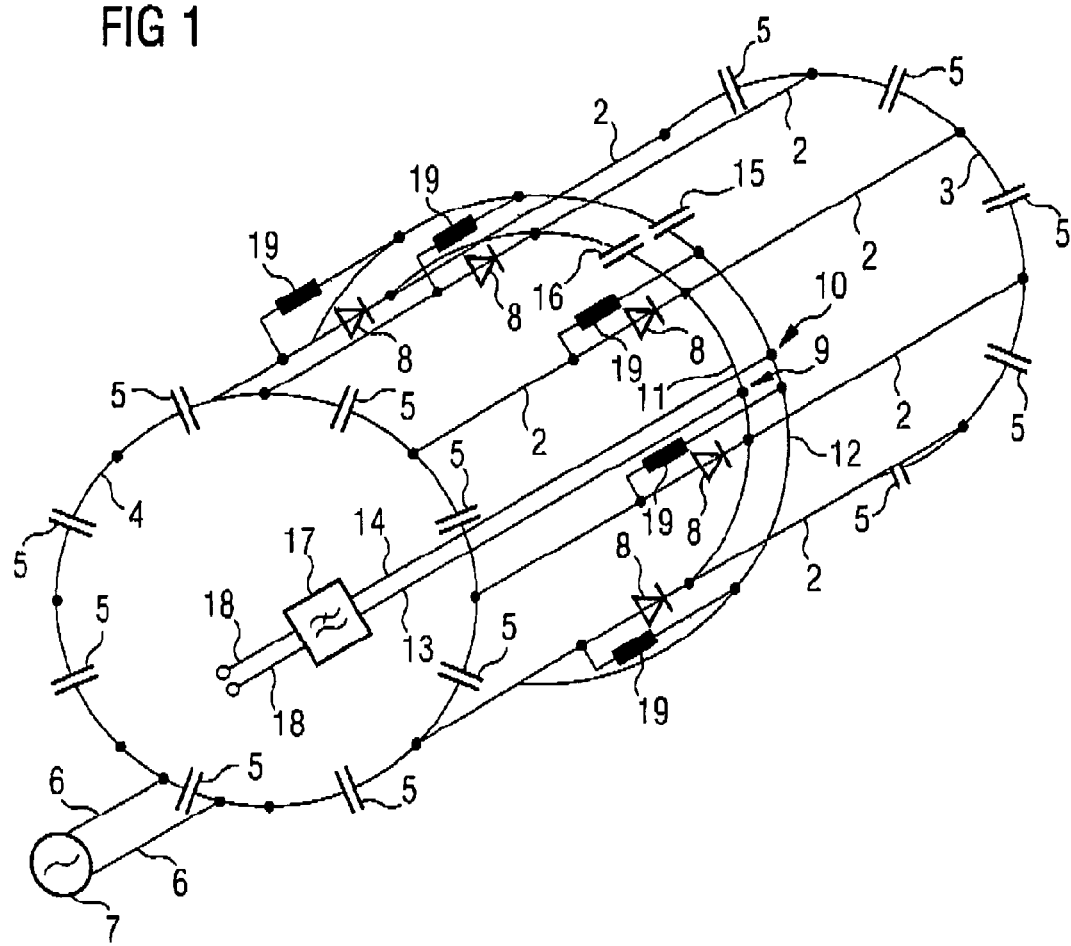
FIG. 1 is a perspective schematic illustration of a three-dimensional wire model of an inventive antenna with a birdcage structure with eight longitudinal rods.

FIG. 1 shows the typical assembly of a birdcage structure in the form of a simple three-dimensional wire model. Such a birdcage structure is comprised of a number of equidistant longitudinal antenna rods arranged running in parallel on a cylindrical surface. These longitudinal rods are respectively connected among one another in terms of radio-frequency at the ends via antenna ferrules 3, 4. "Connected in terms of radio-frequency" means, in this context, that a galvanic connection is not mandatory, but rather only a connection transparent for radio-frequency currents has to exist. As shown in FIG. 1—as is typically the case in magnetic resonance antennas according to the birdcage structure—resonance capacitors 5 are located in the antenna ferrules, respectively between two connection points of adjacent longitudinal antenna rods 2. For clarity, here all structures are shown only on the outside of an imaginary cylinder around which the wire model extends.

In the exemplary embodiment shown in FIG. 1, the ferrules 3, 4 are each continuously circular. Alternatively, the ferrules 3, 4 could be formed by straight sections each running between two longitudinal antenna rods 2. The antenna would then, for example in an exemplary embodiment with eight longitudinal rods, exhibit an octagonal shape.

Such a birdcage structure in principle can have an arbitrary number of longitudinal rods 2. Thus a smaller antenna can have, for example, only six longitudinal rods. In an exemplary embodiment presently developed but not shown in the figures for better clarity, the birdcage structure comprises sixteen longitudinal rods.

The magnetic resonance antenna 1 is connected to a radio-frequency pulse generator 7 via feed lines 6. The feed lines 6 are respectively connected to one of the ferrules 4 to the right and left next to a resonance capacitor 5. Not only the feeding of the radio-frequency pulses in the transmission mode, but also the outfeed of the detected magnetic resonance signals in the reception mode ensues via this feed line 6.

This assembly is a linear polarized RF feed, meaning that the radio-frequency field (also called B1 field) generated by the radio-frequency pulses within the magnetic resonance antenna 1 is linearly polarized. The invention, however, is independent of the feed and can be used for arbitrary polarizations of the $B_1$ field. Thus, for example, a feed is also possible in which a feed line is connected to a resonance capacitor and a further to a ground plane.

Radio-frequency switching elements in the form of PIN diodes 8 are respectively located in the are of the geometric center of the longitudinal antenna rods 2, between the ferrules 3, 4. By suitable connection of these PIN diodes 8, the longitudinal rods 2 can be interrupted in terms of radio-frequency to detune the entire birdcage magnetic resonance antenna 1.

The individual PIN diodes 8 are, in accordance with the invention, respectively connected to common switching lines 9, 10, via which the necessary direct voltage or the direct current is supplied to the PIN diodes 8 from outside the antenna structure.

There are two switching lines 9, 10 which are each formed by a ring line 11 or 12 running perpendicular to the longitudinal antenna rods 2 and a feeder 13 or 14 connected to the appertaining ring line 11 or 12 and running parallel to the longitudinal antenna rods 2 from an end face of the birdcage structure. One of the ring lines 11 is connected to the cathode side, the other ring line 12 is connected to the anode side of the PIN diodes 8.

Each rig line 11, 12 is galvanically interrupted at a location by capacitive components 15, 16, but the lines are closed in terms of radio-frequency by the respective capacitive components 15, 16. This has the advantage that in terms of radio-frequency a complete symmetry of these lines exists, such that no influence of the radio-frequency structure of the magnetic resonance antenna ensues hereby. Moreover, generation of eddy currents in the ring lines 11, 12 is prevented given a switching of gradient coils of the magnetic resonance system.

Figure 2:
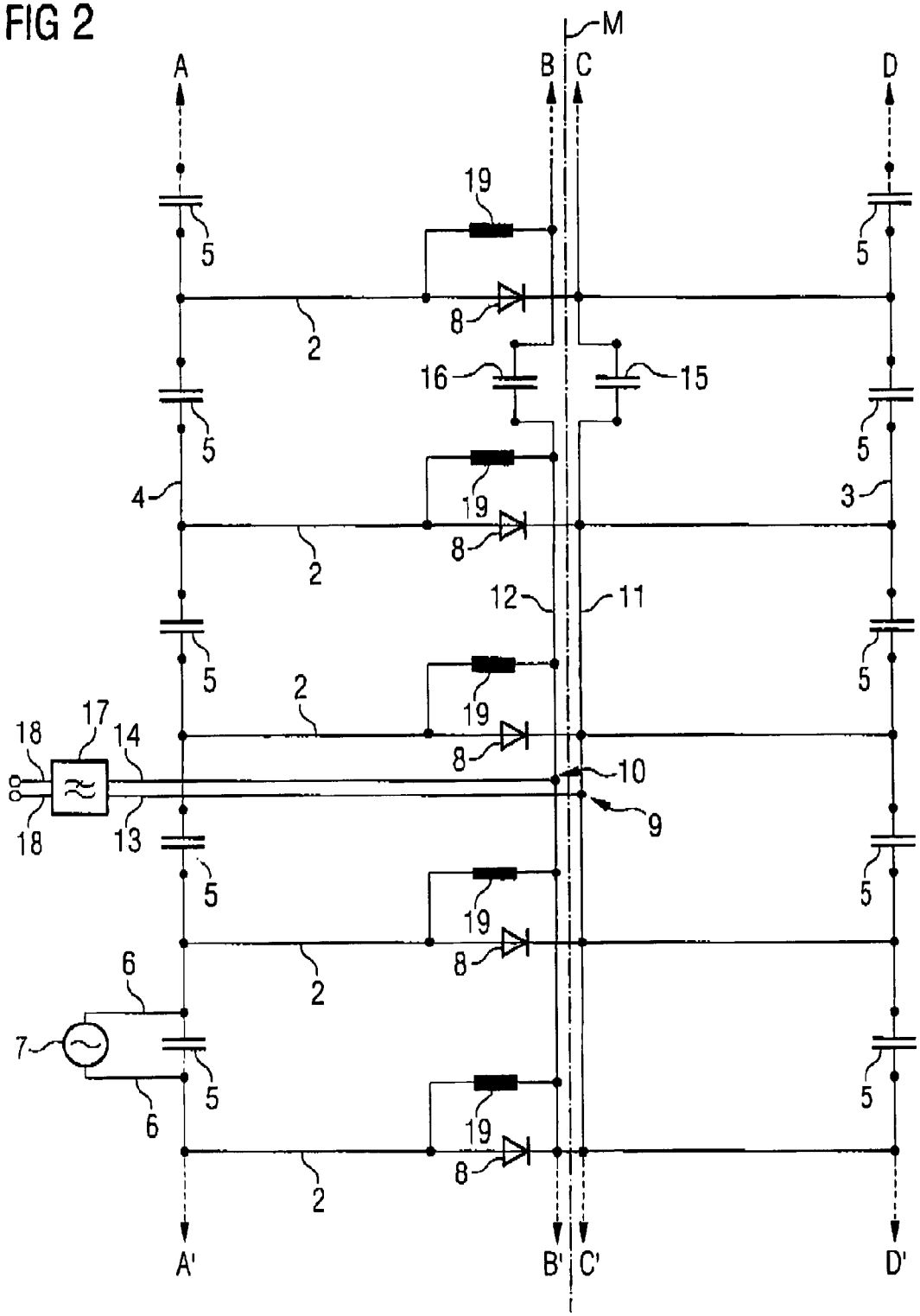
FIG. 2 is a plan view of a part of the birdcage structure according to FIG. 1, unwound from the cylindrical form.

For further explanation of the coupling of the PIN diodes 8 to the ring lines 11. 12, reference is made to FIG. 2, in which a section is shown from the three-dimensional wire model in the form of an unwinding thereof. The ends A–A', B–B', C– C', D–D' of the ferrules 3, 4 or the ring lines 11, 12 are respectively connected among one another via interconnection of corresponding longitudinal antenna rods 2 and resonance capacitors 5 arranged in the ferrules 3, 4.

As can be send from FIGS. 1 and 2, the cathode-side ring line 11 galvanically connects all longitudinal rods 2 with one another. For this, the cathode-side ring line 11 runs precisely in the geometric center of the longitudinal antenna rods 2 between both ferrules 3, 4 (FIG. 1). Since the geometric centers of the longitudinal antenna rods 2 represent, in terms of radio-frequency, an equipotential line, such an electrical connection among one another is possible without influencing the functionality of the magnetic resonance antenna 1.

The connection of the other ring line 12 with the part of the longitudinal antenna rods 2 connected at the anode side of the PIN diodes 8 ensues via choke coils 19 that act as low-pass filters. This means there is no connection in terms of radio-frequency between the longitudinal antenna rods 2 and the anode side ring line 12 or, respectively, the feeder 10. This second, anode-side ring line 12 is likewise located in the area of the geometric center of the longitudinal rods 2, but coaxial to the first cathode-side ring line 11 on a larger radius. For better clarity, in FIG. 2 both ring lines 11, 12 are shown slightly displaced from the geometric center M. The actual geometric arrangement can be recognized by comparison with FIG. 1.

As is in particular easily seen from FIG. 2, all PIN diodes 8 are connected in parallel in terms of direct current, with the ring line 12 that lies radially outwardly representing a common connection electrode for the anodes of the PIN diodes 8, and the inner ring line 11 connecting the longitudinal antenna rods 2 among one another forming a common connection electrode for the cathodes of all PIN diodes 8.

As mentioned above, the longitudinal antenna rods 2 and the ferrules 3, 4—different than these appear from the schematic representations—normally are not fashioned in the form of wires, but rather in the form of conductor runs or tracks on flexible foils which, for example, are curved into a cylindrical shape and are correspondingly connected at the ends to form complete rings. Given the use of multilayer conductor track foils, it is in principle possible to realize the ring lines 11, 12 in turn in the form of conductor tracks together with the birdcage structure in a multilayer conductor track foil.

The supply of the direct current necessary to switch the PIN diodes 8 from the outside to the ring lines 11, 12 ensues via feeders 13, 14 connected to the ring line 11, 12 and running parallel to the longitudinal antenna rods 2. In an exemplary embodiment, these feeders 13, 14 are realized as two glued (bonded) GFK plates with a copper lamination, isolated from one another and running in parallel. The rest of the ring lines 11, 12 can be fashioned from the same material. The current supply plates run, as shown in the feeders 13, 14 in FIG. 1, 2, perpendicular to the ring lines 11, 12 connected thereto. By means of this consequently symmetrical design of the current supply, it is ensured that no magnetic field emanates from the feeders 13, 14 and the ring lines 11, 12, because the magnetic fields created by the current supply are mutually cancelled.

The current supply via the switching lines 9, 10 ensues via a low-pass filter 17 to whose switch input 18 the necessary direct voltage is applied to switch the PIN diodes 8.

Figure 3:
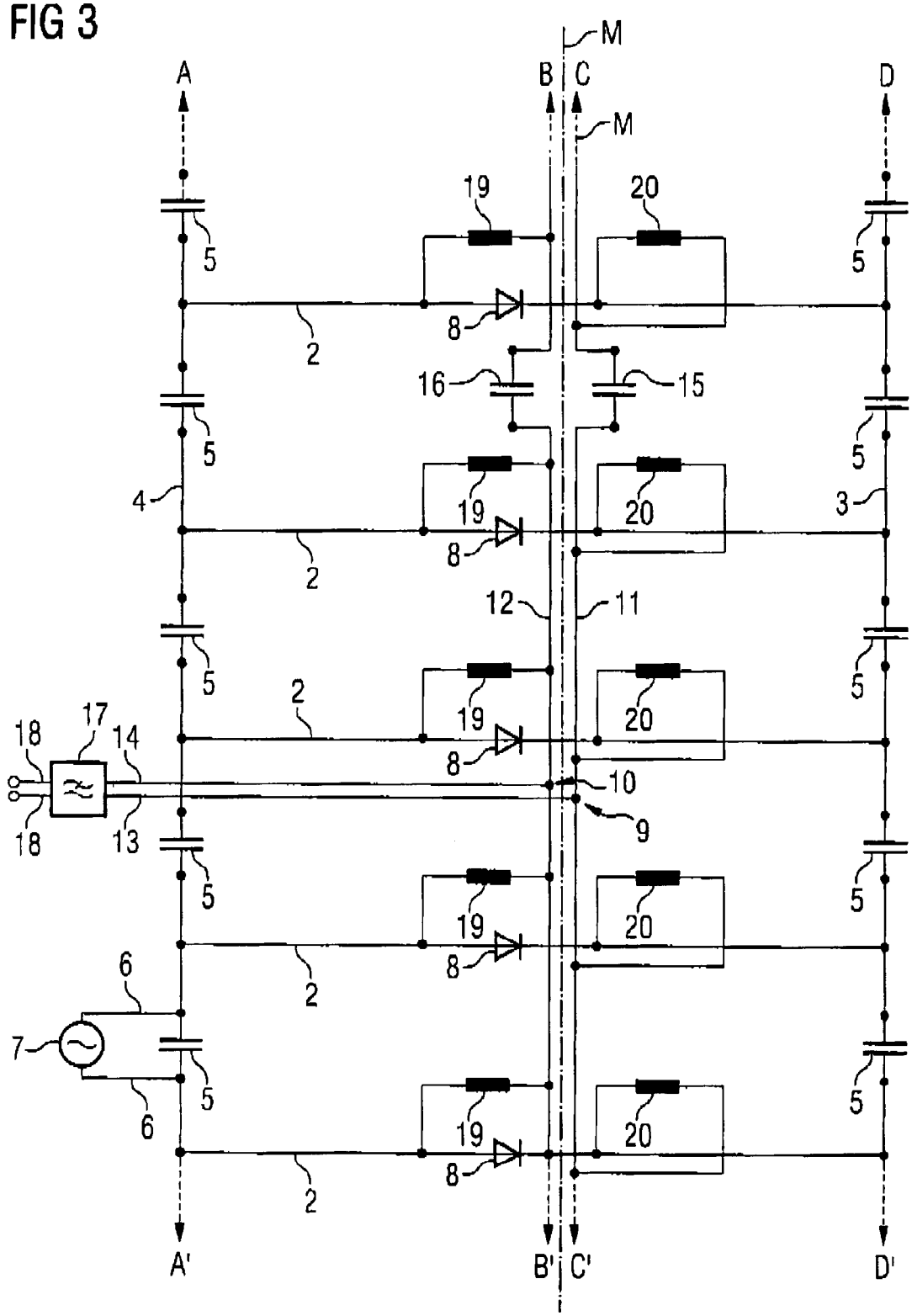
FIG. 3 is a plan view of an unwound birdcage structure similar to that in FIG. 1, but with an unwound coupling of the ring lines to the birdcage structure.

FIG. 3 shows a further exemplary embodiment for a connection of the PIN diodes 8 in the longitudinal antenna rods 2 of an antenna 1 according to FIGS. 1 and 2, wherein the anode-side ring line 12 and the cathode-side ring line 11 are connected via respective choke coils 19, 20 with the longitudinal antenna rods 2, and thus with the PIN diodes 8.

In this exemplary embodiment, there is consequently no connection whatsoever in terms of radio-frequency of the ring lines 11, 12 with the resonant structure, such that an influence of the ring lines 11, 12 in terms of radio-frequency on the parameters of the birdcage magnetic resonance antenna 1 can be completely eliminated. Given such a two-sided coupling of the PIN diodes 8 via the choke coils 19, 20, the symmetry conditions are additionally maintained. Such an assembly is somewhat more elaborate than the assembly according to the first exemplary embodiment of FIGS. 1 and 2. The assembly of FIG. 3, however, is particularly suited for applications in which the magnetic resonance antenna must be assuredly transparent for a wide frequency range, for example because the magnetic resonance signals are transmitted by other coils that operate in completely different frequency ranges, or that are adjusted over a wide frequency range in uses known as "X-nuclear spectroscopy applications".

Each choke coil 19, 20 through which current flows generate its own static magnetic field. In order to minimize the influence of this magnetic field on the magnetic resonance antenna 1, the choke coils preferably are connected anti-parallel in pairs, as is the case, among other things, in the exemplary embodiment according to FIG. 3. The magnetic field components of the individual choke coils 19, 20 then largely mutually cancel by vectorial superimposition.

In principle, this technique is also possible when the PIN diodes 8 are only connected on one side—for example, only on the anode side, as in FIG. 2—with the ring line 12 via choke coils. An exemplary embodiment of this is shown in FIG. 4 according to sections for an individual PIN diode 8.

Figure 4:
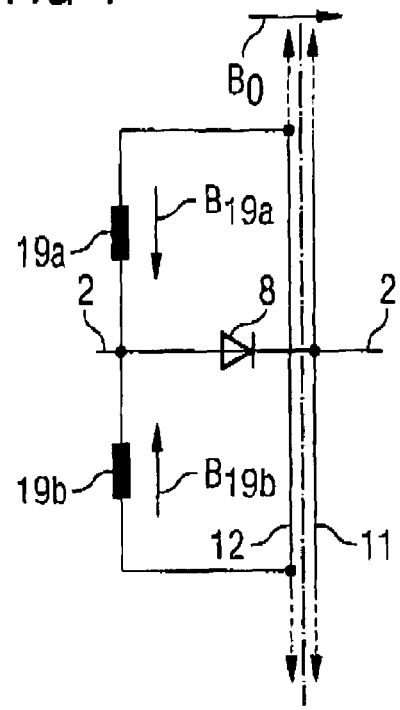
FIG. 4 is a schematic circuit diagram of a third variant to connect a PIN diode within a longitudinal rod of the birdcage structure.

The PIN diode 8 in FIG. 4 is not connected to the anode-side ring line 12 via an individual coil 19 (as in the exemplary embodiments according to FIGS. 1 and 2), but rather via two choke coils 19a, 19b connected in parallel that are geometrically arranged anti-parallel. Additionally, here the coils 19a, 19b are geometrically arranged such that the magnetic field $B_{19a}$, $B_{19b}$ induced by a through-flowing current is respectively perpendicular to the $B_0$ field which runs parallel to the longitudinal antenna rods 2. The superimposition of the magnetic resonance-relevant $B_0$ field by the magnetic field $B_{19a}$, $B_{19b}$ of the choke coils 19a, 19b is minimized by these measures as much as possible.

Figure 5:
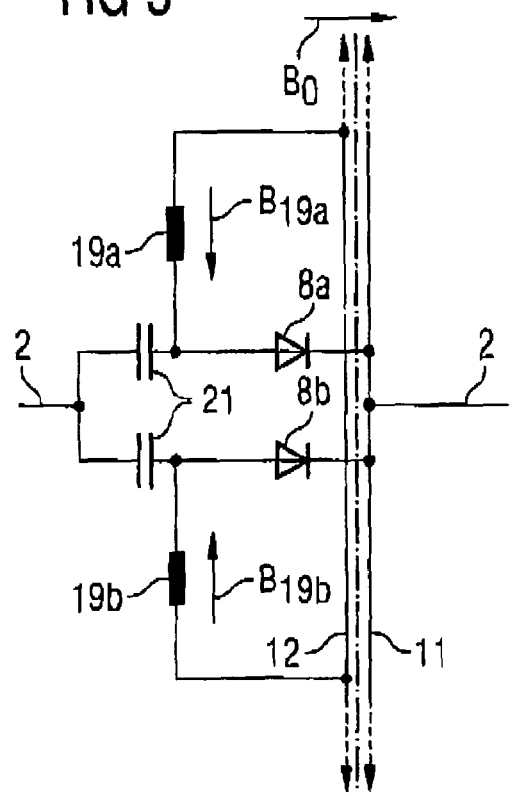
FIG. 5 is a schematic circuit diagram of a fourth variant to connect a PIN diode within a longitudinal rod of the birdcage structure.
Figure 6:
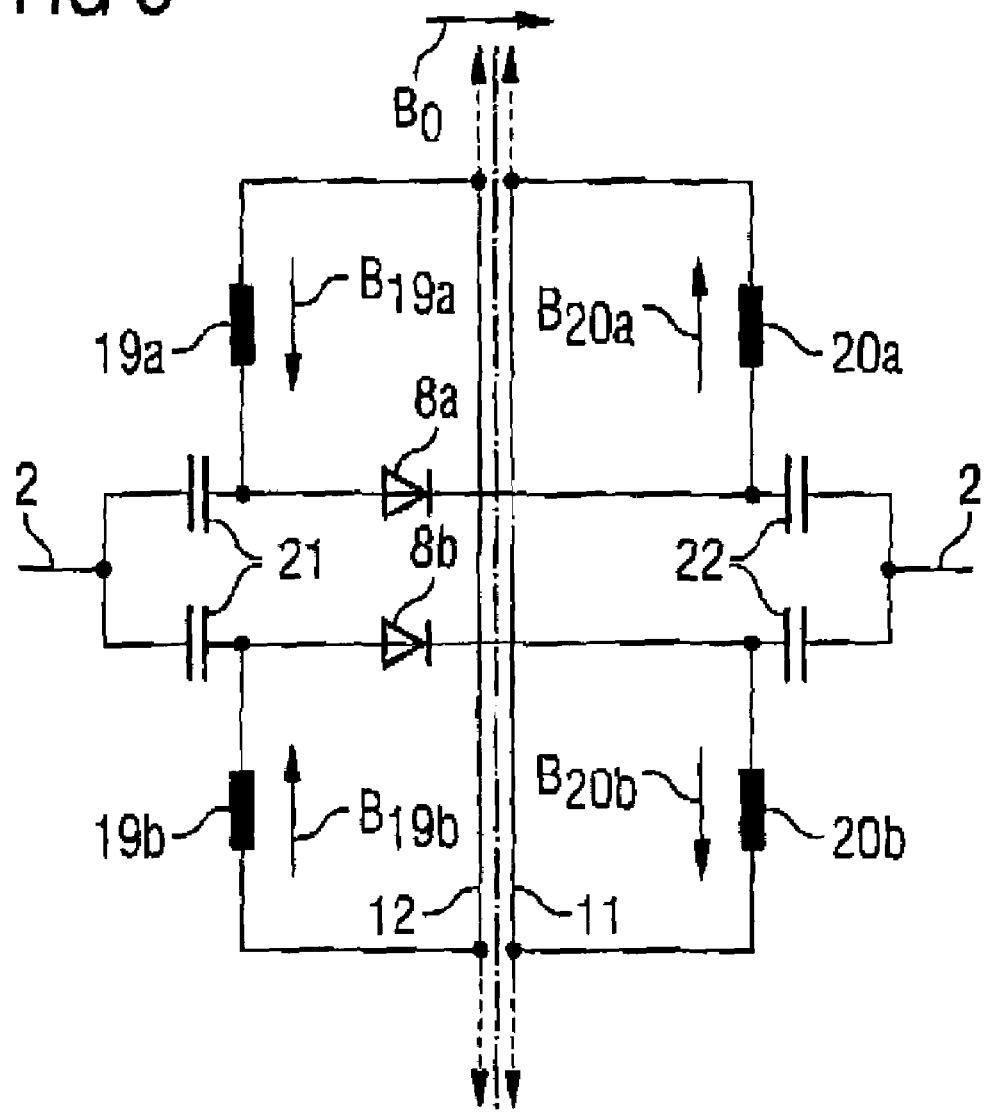
FIG. 6 is a schematic circuit diagram of a fifth variant to connect a PIN diode within a longitudinal rod of the birdcage structure.

FIGS. 5 and 6 show alternative connection examples for configurations with reciprocal field compensation of the choke coils and field direction orthogonal to the $B_0$ field.

In FIG. 5, in place of a PIN diode 8, two parallel PIN diodes 8a, 8b are circuited in the longitudinal antenna rod 2. A galvanic division of the anode-side connections of the PIN diodes 8a, 8b ensues by anode-side direct current surge protection capacitors 21 upstream from (connected before) the PIN diodes 8a, 8b. These capacitors 21 are transparent in terms of radio-frequency, meaning they have no influence on the radio-frequency structure of the birdcage magnetic resonance antenna 1. Alternatively, one capacitor 21 would also be sufficient. Choke coils 19a, 19b are in turn connected between the capacitors 21 and the anode-side connections of the PIN diodes 8a, 8b in order to connect the anode-side connections of the PIN diodes 8a, 8b with the appertaining ring line 12.

FIG. 6 shows an expansion of the exemplary embodiment according to FIG. 5 wherein connections in terms of radio-frequency between the ring lines 11, 12 and the longitudinal antenna rod 2 are no longer present. Analogous to the anode side, the PIN diodes 8a, 8b in FIG. 6 are also each connected cathode-side to the ring line 11 via choke coils 20a, 20b. The individual choke coils 19a, 19b, 20a, 20b are cross-connected in parallel, such that a maximum compensation is enabled between the magnetic fields $B_{19a}$, $B_{19b}$, $B_{20a}$, $B_{20b}$. A division in terms of direct current of the cathode-side and anode-side connections of both PIN diodes 8a, 8b connected in the longitudinal antenna rod 2 in terms radio-frequency also ensues here again via direct current division capacitors 21, 22, which are transparent for radio-frequency currents and therefore do not influence the birdcage structure. For symmetry, four direct current division capacitors 21, 22 are provided here. In principle, however, it is not necessary to incorporate all four division capacitors 21, 22.

The invention offers an extremely effective (in terms of its function) and cost-effective (in terms of its production) solution to the problem of detuning a magnetic resonance antenna fashioned in a birdcage structure given higher magnetic field strengths. The direction of the direct current signals necessary for the detuning through the radio-frequency-active region of the birdcage structure ensues without interference with the radio-frequency functionality. By the consequent symmetric direction of the current-directing components for the detuning device, and preferably via an anti-parallel arrangement of the choke coils, it is ensured that no superimposition of the main magnetic field components ensues. A primary advantage with regard to a detuning device at the antenna ferrules of the birdcage structure is the greater detuning effect. The advantage in comparison to detuning the longitudinal antenna rods with separate current supply for the individual radio-frequency switching elements is that a significantly simple, more cost-effective assembly is achieved, which affords the possibility (used in addition to the assembly) of the compensation of the magnetic fields of the individual choke coils.

It should again be noted that the figures represent only exemplary embodiments. Thus variations of the exemplary embodiments are possible without departing from the framework of the invention. In particular, it is not necessary for each of the longitudinal antenna rods to be provided with a radio-frequency switching element. It is sufficient, for example, to detune a birdcage structure within a magnetic resonance system that is used only for a "normal" proton imaging when the grid of the birdcage structure is made larger-meshed via interruption of individual longitudinal rods. In this manner, a sufficient detuning can be achieved with regard to the proton resonant frequency. An interruption of only one part of the longitudinal antenna rods is more cost-effective due to the lesser expenditure in the assembly of the structure connected therewith. In contrast, an interruption of all longitudinal antenna rods has advantages when such a magnetic resonance antenna should also be used in X-nuclear spectroscopy applications, since the interruption of all longitudinal antenna rods, and thus the entire grid structure, ensures that the antenna is transparent over a very large RF range.

Although the example has predominantly been specified in examples of magnetic resonance systems in the medical field, the possibilities for use of the invention are not limited to this field, but rather the invention can likewise also be used in scientific and/or industrial systems.

We claim as Our Invention:

1. A magnetic resonance antenna having a longitudinal axis, comprising:
   a birdcage structure having a longitudinal axis and having an eigen-resonance frequency, said birdcage structure comprising a plurality of parallel, longitudinal antenna rods, each having opposite ends, and antenna ferrules respectively at said opposite ends of said longitudinal antenna rods connected to said longitudinal antenna rods in terms of radio-frequency;
   a plurality of radio-frequency switching elements respectively connected to said antenna rods for, when switched, interrupting the respective antenna rods in terms of radio-frequency for detuning said eigen-resonance frequency with respect to an operating magnetic resonance frequency; and
   two switching lines connected in common to said radio-frequency switching elements from an exterior of said birdcage structure, each switching line comprising a ring line disposed annularly with respect to said birdcage structure and transversely to said longitudinal antenna rod.

2. A magnetic resonance antenna as claimed in claim 1 wherein said longitudinal antenna rods define a cylindrical surface, and wherein each ring line proceeds annularly in said cylindrical surface.

3. A magnetic resonance antenna as claimed in claim 1 wherein said longitudinal antenna rods define a cylindrical surface, and wherein each ring line proceeds annularly on said cylindrical surface.

4. A magnetic resonance antenna as claimed in claim 1 wherein at least one of said ring lines has a galvanic interruption therein.

5. A magnetic resonance antenna as claimed in claim 4 wherein said galvanic interruption comprises, in each ring line, a capacitive element connected in that ring line.

6. A magnetic resonance antenna as claimed in claim 1 wherein each switching line further comprises a feeder connected to the ring line thereof, each feeder proceeding from an end face of said birdcage structure and being disposed parallel to said longitudinal antenna rods.

7. A magnetic resonance antenna as claimed in claim 1 wherein each of said longitudinal antenna rods has a geometric center between the ferrules, and wherein, in each longitudinal antenna rod, the switching element thereof is disposed at a location at least approximately coinciding with said geometric center.

8. A magnetic resonance antenna as claimed in claim 1 wherein each of said radio-frequency switching elements is connected to the respective ring lines by a connection from the respective longitudinal antenna rod.

9. A magnetic resonance antenna as claimed in claim 6 wherein each of said ring lines has a geometric center between said ferrules, and wherein at least one of said ring lines is connected to the respective longitudinal antenna rods at respective locations at least approximately coinciding with the respective geometric centers.

10. A magnetic resonance antenna as claimed in claim 1 wherein the respective radio-frequency switching elements are connected to the respective ring lines via a component forming an ohmic resistance.

11. A magnetic resonance antenna as claimed in claim 1 wherein the respective radio-frequency switching elements are connected to the respective ring lines via at least one inductive element.

12. A magnetic resonance antenna as claimed in claim 11 wherein each inductive element comprises a coil.

13. A magnetic resonance antenna as claimed in claim 12 for use in a basic magnetic field having a basic magnetic field direction, and wherein each of said coils generates a coil magnetic field having a coil magnetic field direction, and wherein each of said coils is physically disposed with said coil magnetic field direction perpendicular to said basic magnetic field direction.

14. A magnetic resonance antenna as claimed in claim 12 wherein the respective radio-frequency switching elements are connected to the respective ring lines via a pair of coils connected anti-parallel.

15. A magnetic resonance antenna as claimed in claim 1 wherein the respective longitudinal antenna rods are connected to the respective ring lines via at least one inductive element.

16. A magnetic resonance antenna as claimed in claim 15 wherein each inductive element comprises a coil.

17. A magnetic resonance antenna as claimed in claim 16 for use in a basic magnetic field having a basic magnetic field direction, and wherein each of said coils generates a coil magnetic field having a coil magnetic field direction, and wherein each of said coils is physically disposed with said coil magnetic field direction perpendicular to said basic magnetic field direction.

18. A magnetic resonance antenna as claimed in claim 12 wherein the respective longitudinal antenna rods are connected to the respective ring lines via a pair of coils connected anti-parallel.

19. A magnetic resonance antenna as claimed in claim 1 wherein each of said switching lines is disposed at a same longitudinal position between said antenna ferrules and proceed annularly coaxially on respectively different radii relative to said birdcage structure.

20. A magnetic resonance antenna as claimed in claim 1 wherein each of said radio-frequency switching elements is a radio-frequency switching diode.

21. A magnetic resonance antenna as claimed in claim 20 wherein each of said radio-frequency switching diodes has an anode connected to one of said ring lines and a cathode connected to the other of said ring lines.

22. A magnetic resonance antenna as claimed in claim 1 comprising a low-pass filter connected at an input side of at least one of said switching lines.

23. A method for detuning an eigen-resonance frequency of a magnetic resonance antenna having a birdcage structure with a longitudinal axis formed by a plurality of parallel, longitudinal antenna rods and antenna ferrules respectively connected at opposite ends of said antenna rods in terms of radio-frequency comprising the steps of:

interrupting at least one part of each of said longitudinal antenna rods in terms of radio-frequency with a radio-frequency switching elements;

switching the respective radio-frequency switching elements in common via two switching lines connected to the respective radio-frequency switching elements from an exterior of the birdcage structure; and forming each of said switching lines with a ring line proceeding annularly relative to said birdcage structure and transversely to said longitudinal antenna rods.

24. A method as claimed in claim 23 wherein each of said longitudinal antenna rods has a geometric center between said ferrules, and comprising interrupting each of said longitudinal antenna rods in terms of radio-frequency at a location at least approximately coinciding with said geometric center.

* * * * *